United States Patent
Koh et al.

(10) Patent No.: US 7,317,250 B2
(45) Date of Patent: Jan. 8, 2008

(54) HIGH DENSITY MEMORY CARD ASSEMBLY

(75) Inventors: Wei H. Koh, Irvine, CA (US); David Chen, Irvine, CA (US)

(73) Assignee: Kingston Technology Corporation, Fountain Valley, CA (US)

( * ) Notice: Subject to any disclaimer, the term of this patent is extended or adjusted under 35 U.S.C. 154(b) by 373 days.

(21) Appl. No.: 10/952,891

(22) Filed: Sep. 30, 2004

(65) Prior Publication Data

US 2006/0072368 A1 Apr. 6, 2006

(51) Int. Cl.
*H01L 23/34* (2006.01)

(52) U.S. Cl. ............................ 257/724; 257/E25.023; 257/685; 257/686; 257/777; 361/761; 361/764; 174/260; 365/232

(58) Field of Classification Search ........ 257/E25.013, 257/723, 724, 778, 685, 686, 777, E25.011, 257/E25.023, 730; 361/761, 764, 790; 174/260, 174/250, 255; 365/232
See application file for complete search history.

(56) References Cited

U.S. PATENT DOCUMENTS

| | | | | |
|---|---|---|---|---|
| 5,138,438 A * | 8/1992 | Masayuki et al. | ........ | 257/686 |
| 5,386,343 A * | 1/1995 | Pao | ............ | 361/761 |
| 5,421,081 A * | 6/1995 | Sakaguchi et al. | ............ | 29/840 |
| 5,530,292 A * | 6/1996 | Waki et al. | .......... | 257/724 |
| 5,801,438 A * | 9/1998 | Shirakawa et al. | .......... | 257/685 |
| 5,831,833 A * | 11/1998 | Shirakawa et al. | ......... | 361/762 |
| 5,949,135 A * | 9/1999 | Washida et al. | ............ | 257/685 |
| 6,154,371 A * | 11/2000 | Oba et al. | .................... | 361/764 |
| 6,160,718 A * | 12/2000 | Vakilian | .................... | 361/803 |
| 6,324,067 B1 * | 11/2001 | Nishiyama | .................... | 361/761 |
| 6,333,566 B1 * | 12/2001 | Nakamura | .................... | 257/790 |
| 6,365,963 B1 * | 4/2002 | Shimada | .................... | 257/686 |
| 6,445,591 B1 * | 9/2002 | Kwong | .................... | 361/761 |
| 6,452,278 B1 * | 9/2002 | DiCaprio et al. | ........... | 257/777 |
| 6,469,395 B1 * | 10/2002 | Nishihara et al. | ........... | 257/781 |
| 6,713,854 B1 * | 3/2004 | Kledzik et al. | ............ | 257/686 |
| 6,777,798 B2 * | 8/2004 | Fukumoto et al. | .......... | 257/686 |
| 6,906,415 B2 * | 6/2005 | Jiang et al. | .................. | 257/723 |
| 6,982,485 B1 * | 1/2006 | Lee et al. | .................... | 257/737 |

* cited by examiner

*Primary Examiner*—Kenneth Parker
*Assistant Examiner*—Chris C. Chu
(74) *Attorney, Agent, or Firm*—Morland C. Fischer

(57) ABSTRACT

A high density memory card assembly having application for USB drive storage, flash and ROM memory cards, and similar memory card formats. A cavity is formed through a rigid laminate substrate. First and second digital memory devices (e.g., TSOP packages or bare semiconductor dies) are located within the cavity so as to be recessed relative to the top and bottom of the substrate. The recessed first and second memory devices are arranged in spaced, face-to-face alignment with one another within the cavity. The first and second memory devices are covered and protected by respective first and second memory packages that are located on the top and bottom of the substrate. By virtue of the foregoing, the memory package density of the assembly can be increased without increasing the height or area consumed by the assembly for receipt within an existing external housing.

8 Claims, 2 Drawing Sheets

HIGH DENSITY MEMORY CARD ASSEMBLY

BACKGROUND OF THE INVENTION

1. Field of the Invention

This invention relates generally to memory device packaging and, more particularly, to high density digital memory cards having application for USB drive storage, flash and ROM memory cards, and other memory cards of similar format.

2. Background Art

Most conventional memory card assemblies (excluding the outside casing) include a rigid laminate substrate, such as an FR-4 printed wiring board (PWB), a controller, the required passive components, and at least one digital (e.g., flash) memory storage device in a TSOP (thin small outline package) type 1 package. The TSOP 1 packages are desirable because of their thin profile, typically only 1.2 mm high, and small overall footprint that can meet the size limitations of a memory card. While a memory card may vary in size and shape, most have limited thickness in order to be able to fit into the slot of a reader that is adapted to receive specific types of memory cards. For example, a standard compact flash (CF) card has an overall thickness of 3.3 mm, a secure digital (SD) card has a thickness of 2.1 mm, and a multimedia card (MMC) is only 1.4 mm thick. Even a relatively bulky USB drive storage card has an overall thickness that is typically less than 10 mm.

Because of the thin profile restriction established by the reader in which the memory card must fit, the overall thickness of the substrate/package assembly is confined to that of a thin form factor. Typically, a monolithic (i.e., single) package assembly is arranged on one side of the substrate. To double the density of the memory, a TSOP package may also be assembled on the opposite side of the substrate.

To overcome the space constraint, while increasing the memory density, the typical solution has heretofor been to use a stacked-die TSOP package, wherein two or more flash ICs are stacked one above the other inside a single package. A stacked-die TSOP package may retain its overall outside dimension, including thickness, by using two thinned ICs inside the package. Therefore, during assembly, the overall profile of the stacked-die package will remain the same as the thickness of a single die package.

However, such a stacked-die package is more difficult and expensive to manufacture. First, the IC chip must be thinned to less than one half the normal IC thickness in order to fit inside the package. In addition, the package assembly procedure is more complicated than that used for a standard, single-die package assembly. Finally, the assembled package must undergo functional testing. If one of the two IC devices fails, the standard-die package may have to be downgraded to the equivalent of a single-die package. In other cases, the stacked-die package having a single defective IC device may become entirely unusable. Consequently, if the test yield is low, it can prove to be costly in situations where stacked-die packages are used to achieve high density for memory cards.

Accordingly, what is needed is a high density memory card assembly (e.g., for use as a USB drive or flash storage memory card) that preferably uses a standard single die package that is a readily available industry standard so that the testing and assembly of the package follow established procedures that are widely known and of relatively low cost.

SUMMARY OF THE INVENTION

In general terms, what is disclosed herein is a digital storage memory card such as a USB drive, SD card, MMC card, or a CF card having one or more flash memory device packages to provide non-volatile, digital memory storage. More particularly, a high density arrangement is provided for a memory card assembly using a leadframe type package, such as TSOP, on one or both sides of a flex or rigid-flex substrate to increase the memory package density without substantially increasing the overall height or area consumed. By virtue of the foregoing, the assembly can comfortably fit inside an external housing that has been allocated for typical USB drives and other card formats.

In a preferred embodiment, the substrate has a cavity formed therethrough for receipt of upper and lower digital memory packages in face-to-face alignment with one another so that the packages are recessed relative to the top and bottom of the substrate. A leadframe package is located overhead each of the memory packages that are recessed within the cavity at opposite sides of the substrate. One of the memory packages received within the cavity is turned upside down so that the bottom of the package faces the leadframe package lying thereover. In one case, the perimeter leads of the memory packages within the cavity are connected to respective bonding pads and run along the edges of the cavity at opposite sides of the substrate. In another case, the perimeter leads of the memory packages are connected to the same substrate bonding pads to which the leads of the overhead leadframe packages are connected.

DESCRIPTION OF THE PREFERRED EMBODIMENT

Figure 1:
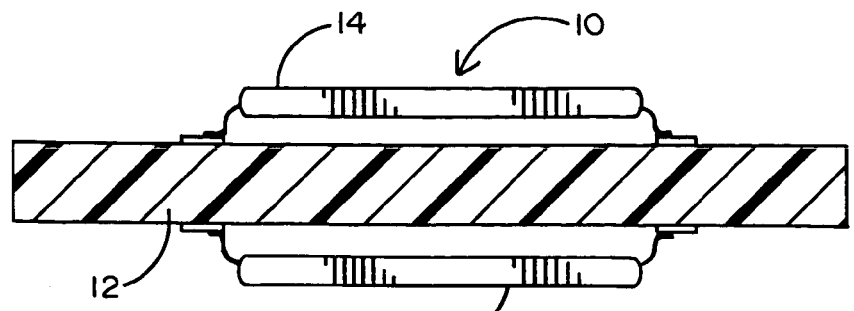
FIG. 1 shows a side view of a conventional two sided memory card assembly having a leadframe package located on each side.

Turning now to the drawings, FIG. 1 shows a conventional memory card 10 having a rigid, solid laminate substrate 12. A first leadframe memory package 14 is connected to one side of the substrate 12, and a second leadframe memory package 16 is connected to the opposite side of the substrate 12. The overall height of the memory card 10 of FIG. 1 must be sufficiently low to fit within an external housing. By way of example, for an MMC card, the overall thickness is limited to 1.4 mm. In the conventional case, the storage capacity of memory card 10 is limited to the leadframe memory packages 14 and 16.

Figure 2:
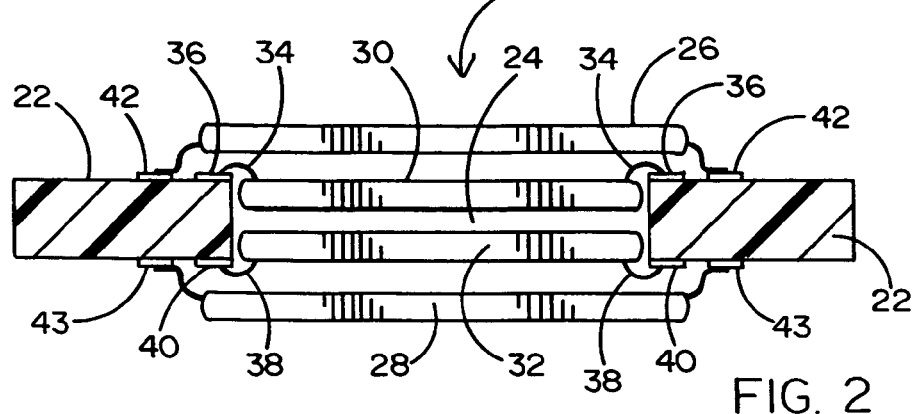
FIG. 2 shows a high density memory card assembly according to one embodiment of the present invention, wherein a cavity is formed through a substrate for receipt of upper and lower digital memory devices which lie below respective overhead leadframe packages.

In accordance with a first preferred embodiment of this invention, a high density memory card assembly 20 having increased non-volatile storage capacity is shown in FIG. 2 of the drawings. The memory card assembly 20 includes either a flex or a rigid-flex substrate 22 having a cavity 24 (best shown in FIG. 3) formed therethrough. Like the conventional memory card 10 of FIG. 1, the high density memory card assembly 20 of FIG. 2 includes a first leadframe memory package 26 attached to the top side of the substrate 22 and a second leadframe memory package 28 attached to the opposite bottom side of substrate 22. A first or upper digital memory package 30 is received by and recessed within the cavity 24 from the top side of the substrate 22. Memory package 30 is turned upside down within the cavity 24 so that the bottom of package 30 faces the first leadframe memory package 26 lying thereover to enable the perimeter leads 34 thereof to be soldered to respective bonding pads 36 that run along opposite edges of the cavity 24 on the top of the substrate 22 (also best shown in FIG. 3).

As is apparent from FIG. 2, the recessed upper memory package 30 lies below and is of smaller length than the overhanging leadframe; memory package 26 which covers package 30. Similarly, the recessed upper memory package 30 must have a sufficiently small width to be received within cavity 24. In the assembled configuration, the first leadframe memory package 26 at the top side of substrate 22 overhangs and protects the recessed upper memory package 30.

To maximize the storage capacity of the memory card assembly 20, a second or lower digital memory package 32 is received by and recessed within the cavity 24 from the opposite bottom side of substrate 22, whereby the upper and lower memory packages 30 and 32 lie in spaced, face-to-face alignment with one another. Another leadframe memory package 28 is attached to the bottom of substrate 22 so as to overhang and cover the recessed lower memory package 32. Like the upper memory package 30, the perimeter leads 38 of the lower memory package 32 are soldered to respective bonding pads 40 that run along opposite edges of the cavity 24 on the bottom of substrate 22. The footprint and thickness of the opposing upper and lower memory packages 30 and 32 must be sufficiently small so as to be recessed relative to the top and bottom of substrate 22 and lie below respective overhanging leadframe memory packages 26 and 28.

In this same regard, it can be appreciated that the overall height of the memory card assembly 20 of FIG. 2 is identical to the height of the conventional memory card assembly 10 shown in FIG. 1. However, in the case of the high density memory card assembly 20 of FIG. 2, additional upper and lower digital memory packages 30 and 32 are efficiently recessed within the cavity 24 formed through the substrate 22 so as to lie below and be protected by leadframe memory packages 26 and 28 that are located at opposite sides of substrate 22 and are common to a conventional memory card assembly. Thus, the memory card assembly 20 of FIG. 2 will not exceed the allowable height restrictions established by the existing external housing for the memory card while providing for an increased digital storage capacity.

Figure 3:
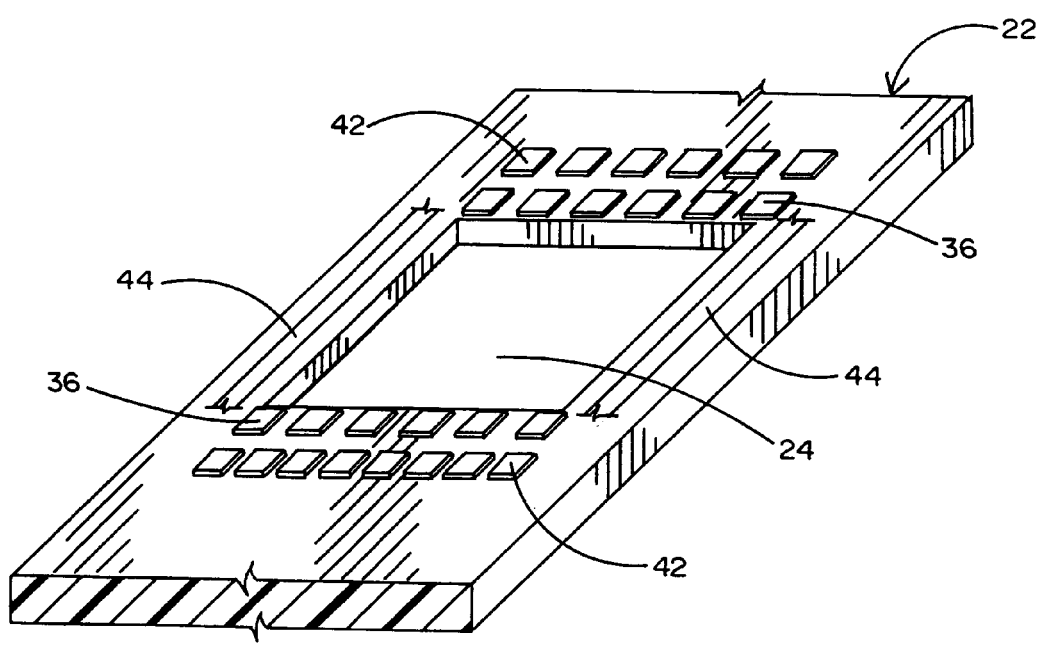
FIG. 3 is a perspective view of the substrate shown in FIG. 2 having the cavity formed therethrough and inner and outer rows of bonding pads running along opposite edges of the cavity.

FIG. 3 of the drawings illustrates the substrate 22 of the memory card assembly 20 of FIG. 2 showing the cavity 24 formed therethrough. As was disclosed when referring to FIG. 2, recessed upper and lower memory packages 26 and 28 are aligned face-to-face one another within the cavity 24 through substrate 22. Inner rows of bonding pads 36 are shown in FIG. 3 located on the top of substrate 22 and running along opposite edges of the cavity 24. In the assembled configuration, the inner rows of bonding pads 36 are electrically connected (e.g., soldered) to respective leads 34 of the recessed upper memory package 30, which lies below the leadframe memory package 26. Similar inner rows of bonding pads (designated 40 in FIG. 2) are located on the bottom on substrate 22 opposite the cavity 24 to be electrically connected (e.g., soldered) to respective leads 38 of the recessed lower memory package 32 which lies below the leadframe memory package 28. Because of the presence of the cavity 24 through the substrate 22, the required signal traces 44 are routed around the cavity.

Outer rows of bonding pads 42 are also shown in FIG. 3 located on top of substrate 22 so as to lie outside the inner rows of bonding pads 36. In the assembled configuration, the outer rows of bonding pads 42 are electrically connected (e.g., soldered) to respective leads of the leadframe memory package 26 which covers the upper memory package 30 at the top of substrate 22. Similar outer rows of bonding pads (designated 43 in FIG. 2) are located on the bottom of substrate 22 to be electrically connected to respective leads of the leadframe memory package 28 which covers the lower memory package 32 at the bottom of substrate 22.

Figure 4:
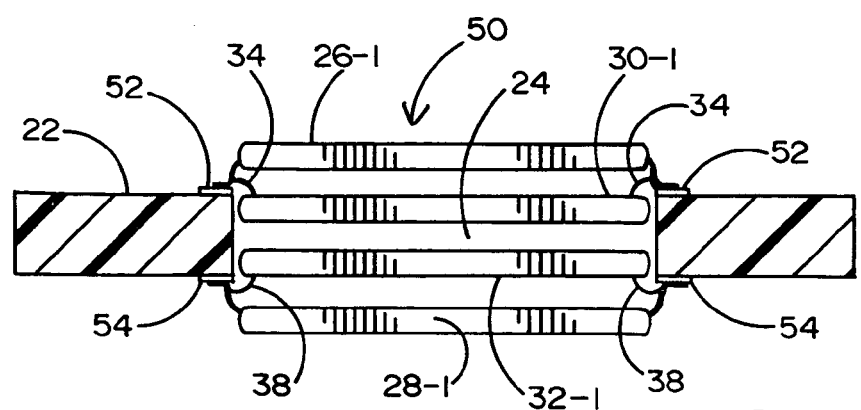
FIG. 4 shows a modified high density memory card assembly with recessed upper and lower digital memory devices and overhead leadframe packages having identical size and sharing the same bonding pads on the substrate.

FIG. 4 of the drawings shows a modification to the high density memory card assembly 20 that is illustrated in FIG. 2. In the memory card assembly 20, the upper and lower memory packages 30 and 32 that are recessed within cavity 24 through substrate 22 are shorter and have a smaller footprint than the overhanging leadframe memory packages 26 and 28. In the high density memory card assembly 50 illustrated in FIG. 4, each of the upper and lower memory packages 30-1 and 32-1 that are recessed within cavity 24 are now of identical size and footprint to the leadframe memory packages 26-1 and 28-1 lying thereover. However, it is within the scope of this invention for the upper and lower packages 30-1 and 32-1 to be smaller than leadframe packages 26-1 and 28-1 in the same manner shown in FIG. 2. Because of their uniform size, the perimeter leads of the leadframe memory package 26-1 and the perimeter leads 34 of the inverted (i.e., turned upside down), recessed upper memory package 30-1 are connected to common bonding pads 52 located on the top of the substrate 22 along the cavity 24. Likewise, the perimeter leads of the leadframe memory package 28-1 and the perimeter leads of the recessed lower memory package 32-1 are connected to common bonding pads 54 located on the bottom of the substrate 22 along cavity 24. Despite the fact that the overlapping leads of the memory packages are connected to common bonding pads 52 and 54, as shown, the traces used for chip selection do not have to share the same pads.

It may be appreciated that by virtue of the present improvement, the memory package density of the memory card assemblies 20 and 50 of FIGS. 2 and 4 is doubled relative to the conventional memory card assembly 10 that is shown in FIG. 1, but without increasing the overall height or area of the assembly. Accordingly, the high density memory card assemblies 20 and 50, when used for a USB drive and similar memory card formats (e.g., compact flash), will consume no more space than the typical memory card assembly within its external housing. To maximize the space efficiency, the memory packages 30, 32 and 30-1, 32-1 that are recessed within the substrate 22 of assemblies 20 and 50 are preferably thin small outline packages (TSOP), very thin small outline packages (WSOP), or the like. However, rather than using TSOP memory packages or other suitably small leadframe packages, it is within the scope of this invention to substitute upper and lower bare semiconductor dies that are wire bonded to the pads 36, 40, 52 and 54 at the top and bottom of substrate 22. In this case, a bare die and leadframe package will be aligned face-to-face at each side of the substrate 22.

For maximum storage capacity, the memory card assemblies 20 and 50 of FIGS. 2 and 4 are shown having both recessed upper and lower memory packages 30, 32 and 30-1, 32-1 inserted into the cavity 24 formed completely through the substrate 22. However, it is to be expressly understood that the storage capacity of the conventional memory card assemblies can still be increased by means of a monolithic package assembly using a single recessed memory package (e.g., 30) and a single protective leadframe package (e.g., 26) lying thereover at only one side of the substrate 22. In this case, the cavity need not extend completely through the substrate in the manner that is otherwise shown in FIG. 3.

We claim:

1. A high density memory card assembly including a substrate, a cavity formed in said substrate, a bonding pad located on top of a first side of said substrate, a digital memory device comprising at least one bare semiconductor die received within said cavity and having a plurality of electrical wire bonds by which to attach said bare semiconductor die to the first side of said substrate, at least one leadframe memory package having a plurality of electrical leads projecting outwardly from the interior thereof by which to attach said memory package to the first side of said substrate, said leadframe memory package being spaced from and covering said bare semiconductor die within said cavity, wherein one of the plurality of wire bonds from said at least one bare semiconductor die is electrically connected at said bonding pad on the first side of said substrate to one of the plurality of leads projecting outwardly from said at least one leadframe memory package.

2. The high density memory card assembly recited in claim 1, wherein said at least one bare semiconductor die received within said cavity and said at least one leadframe memory package spaced from and covering said semiconductor die are of identical length.

3. The high density memory card assembly recited in claim 1, further including a plurality of additional bonding pads located on the top of the first side of said substrate adjacent opposite edges of said cavity, different ones of the plurality of wire bonds of said at least one bare semiconductor die and respective different ones of the plurality of leads projecting outwardly from said at least one leadframe memory package being electrically connected together at the same ones of said plurality of additional bonding pads.

4. The high density memory card assembly recited in claim 1, further including inner rows of additional bonding pads located on the top of the first side of said substrate adjacent opposite edges of said cavity and outer rows of additional bonding pads located on the top of the first side of said substrate and lying outside the inner rows of additional bonding pads, different ones of the plurality of wire bonds from said at least one bare semiconductor die electrically connected to said inner rows of additional bonding pads, and different ones of the plurality of leads projecting from said at least one leadframe memory package electrically connected to said outer rows of additional bonding pads.

5. The high density memory card assembly recited in claim 1, wherein said at least one bare semiconductor die is flipped upside down within said cavity, such that the bottom of said die lies below and faces the bottom of said at least one leadframe memory package.

6. The high density memory card assembly recited in claim 1, wherein said cavity extends completely through said substrate, said memory card assembly further including a second digital memory device comprising another bare semiconductor die received within said cavity so as to lie opposite said at least one bare semiconductor die of said first digital memory device and another leadframe memory package located on the opposite side of said substrate so as to be spaced from and cover said another bare semiconductor die.

7. The high density memory card assembly recited in claim 1, wherein said substrate is flexible.

8. The high density memory card assembly recited in claim 1, wherein said substrate is a rigid-flex substrate.

* * * * *